(12) United States Patent
Yang et al.

(10) Patent No.: US 12,007,816 B2
(45) Date of Patent: Jun. 11, 2024

(54) HEAT DISSIPATION MODULE AND ELECTRONIC DEVICE HAVING THE SAME

(71) Applicant: ASUSTeK COMPUTER INC., Taipei (TW)

(72) Inventors: Dun-Hao Yang, Taipei (TW); Kuang-Yu Chang, Taipei (TW); Ming-Fang Tsai, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 17/852,372

(22) Filed: Jun. 29, 2022

(65) Prior Publication Data

US 2023/0205284 A1 Jun. 29, 2023

(30) Foreign Application Priority Data

Dec. 27, 2021 (TW) ................................ 110215461

(51) Int. Cl.
*G06F 1/18* (2006.01)
*H05K 1/02* (2006.01)

(52) U.S. Cl.
CPC ........... *G06F 1/185* (2013.01); *H05K 1/0204* (2013.01)

(58) Field of Classification Search
CPC . G06F 1/185; G06F 1/20; H05K 2201/10409; H05K 7/2039; H05K 2201/066; H05K 1/0204
See application file for complete search history.

(56) References Cited

U.S. PATENT DOCUMENTS 11,460,895 B2 * 10/2022 Hobbs .................. H05K 7/2039
2022/0375821 A1 * 11/2022 Liang .................. H01L 25/0655

FOREIGN PATENT DOCUMENTS

| CN | 210639548 | 5/2020 |
| CN | 213482795 | 6/2021 |

* cited by examiner

*Primary Examiner* — James Wu
(74) *Attorney, Agent, or Firm* — JCIPRNET

(57) ABSTRACT

A heat dissipation module is adapted for a circuit board, which has an M.2 bonding hole. The heat dissipation module includes a supporting bracket and a heat dissipation element. The supporting bracket has a first side and a second side opposite to each other, and an accommodating space, which is located between the first side and the second side, and is adapted for installing an SSD interface card. The first side has a first mounting hole and a second mounting hole. The heat dissipation element is combined to the first side through the first mounting hole. When the SSD interface card is installed in the accommodating space, the SSD interface card and the supporting bracket are combined to the M.2 bonding hole through the second mounting hole so that the second side faces the circuit board.

9 Claims, 6 Drawing Sheets

HEAT DISSIPATION MODULE AND ELECTRONIC DEVICE HAVING THE SAME

CROSS-REFERENCE TO RELATED APPLICATION

This application claims the priority benefit of Taiwan application serial no. 110215461, filed on Dec. 27, 2021. The entirety of the above-mentioned patent application is hereby incorporated by reference herein and made a part of this specification.

BACKGROUND

Technical Field

The disclosure relates to a heat dissipation module and an electronic device having the same.

Description of Related Art

With the development of science and technology, the storage medium of electronic devices has developed the application of a solid-state drive (SSD) interface card. Due to having the advantages of smaller footprint, larger storage capacity, and higher transmission rate, the SSD interface card is now widely used in the market. However, a high-power SSD interface card generates higher heat, and thus surrounding electronic components may also be damaged.

SUMMARY

A heat dissipation module of the disclosure is adapted for a circuit board. The circuit board includes an M.2 bonding hole. The heat dissipation module includes a supporting bracket and a heat dissipation element. The supporting bracket includes a first side and a second side opposite to each other, and an accommodating space. The accommodating space is located between the first side and the second side, and the accommodating space is adapted for installing an SSD interface card.

The first side includes a first mounting hole and a second mounting hole. The heat dissipation element is combined to the first side through the first mounting hole. When the SSD interface card is installed in the accommodating space, the SSD interface card and the supporting bracket are combined to the M.2 bonding hole through the second mounting hole so that the second side faces the circuit board.

An electronic device of the disclosure includes a housing, a circuit board, an SSD interface card, and a heat dissipation module. The circuit board is disposed in the housing, and the circuit board includes an M.2 bonding hole. The heat dissipation module includes a supporting bracket and a heat dissipation element. The supporting bracket includes a first side and a second side opposite to each other, and an accommodating space. The accommodating space is located between the first side and the second side, and is adapted for installing the SSD interface card.

The first side includes a first mounting hole and a second mounting hole. The heat dissipation element is combined to the first side through the first mounting hole. When the SSD interface card is installed in the accommodating space, the SSD interface card and the supporting bracket are combined to the M.2 bonding hole through the second mounting hole so that the second side faces the circuit board.

When the SSD interface card is installed in the accommodating space of the supporting bracket, the SSD interface card and the supporting bracket are combined to the circuit board through the second mounting hole, and the heat dissipation element is combined to the supporting bracket through the first mounting hole. Thus, the assembly is convenient and the heat dissipation efficiency of the SSD interface card is improved at the same time.

DESCRIPTION OF THE EMBODIMENTS

Figure 1:
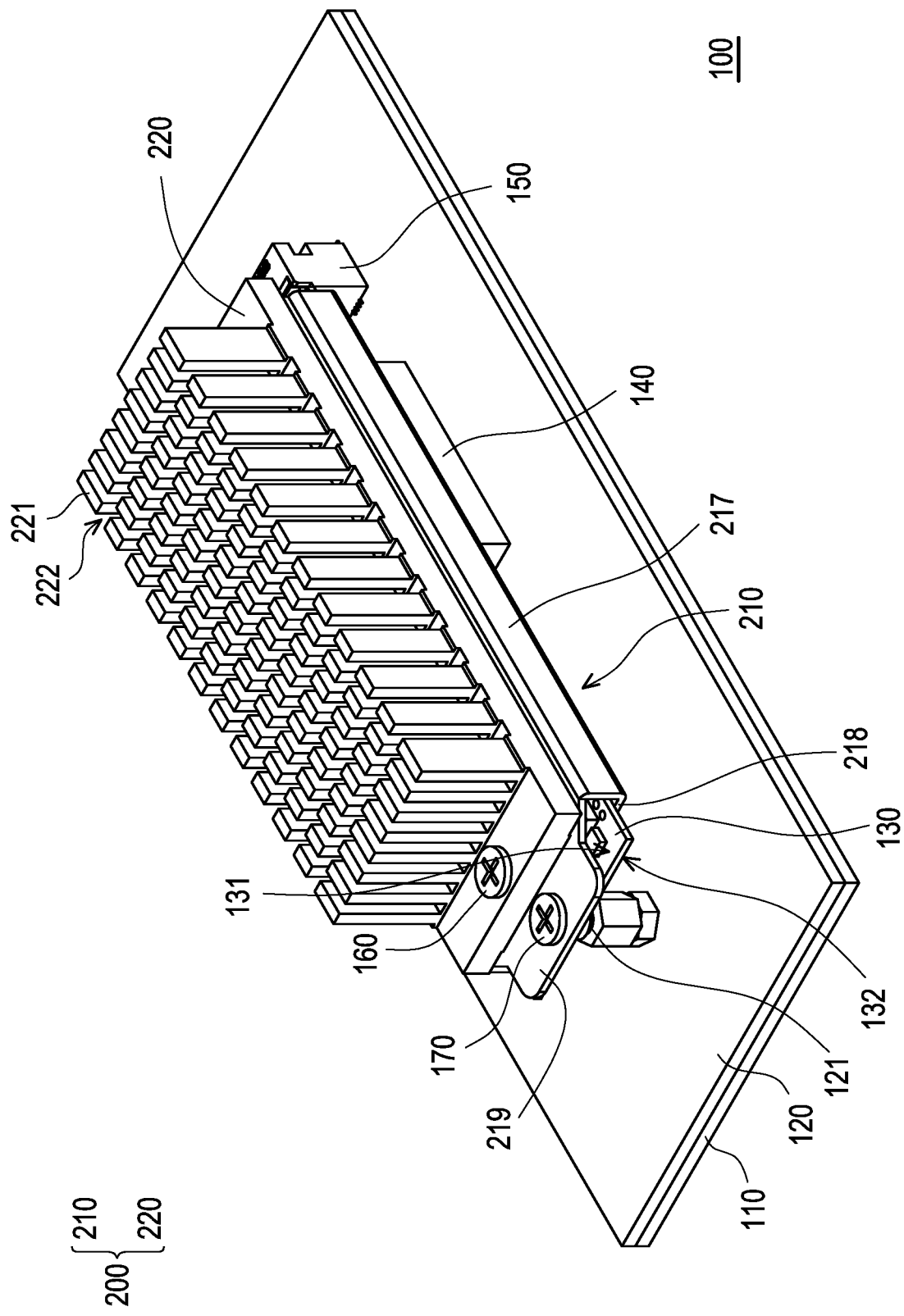
FIG. 1 is a three-dimensional schematic diagram of a heat dissipation module of the disclosure.

Please refer to FIG. 1. FIG. 1 is a three-dimensional schematic diagram of a heat dissipation module of the disclosure. The heat dissipation module 200 provided in the disclosure is adapted for a circuit board 120, and the circuit board 120 includes an M.2 bonding hole 121.

The heat dissipation module 200 includes a supporting bracket 210, a heat dissipation element 220, multiple buffer elements 230, a first heat conductive element 140, and a second heat conductive element 240. The supporting bracket 210 includes a first side 219 and a second side 218 opposite to each other, and an accommodating space 215.

The accommodating space 215 is located between the first side 219 and the second side 218, and is adapted for installing an SSD interface card 130. The first side 219 includes a first mounting hole 211 and a second mounting hole 212.

The heat dissipation element 220 is combined to the first side 219 through the first mounting hole 211. When the SSD interface card 130 is installed in the accommodating space 215, the SSD interface card 130 and the supporting bracket 210 are combined to the M.2 bonding hole 121 through the second mounting hole 212 so that the second side 218 faces the circuit board 120. Moreover, the heat dissipation element 220 dissipates heat of the SSD interface card 130, thereby improving the heat dissipation efficiency of the SSD interface card 130.

In one embodiment, the supporting bracket 210 is made of stainless steel to obtain higher strength, which can reduce the deformation or displacement of the SSD interface card 130 during assembly or transportation.

In one embodiment, the heat dissipation element is made of copper or aluminum material to obtain higher heat conduction efficiency.

Figure 2:
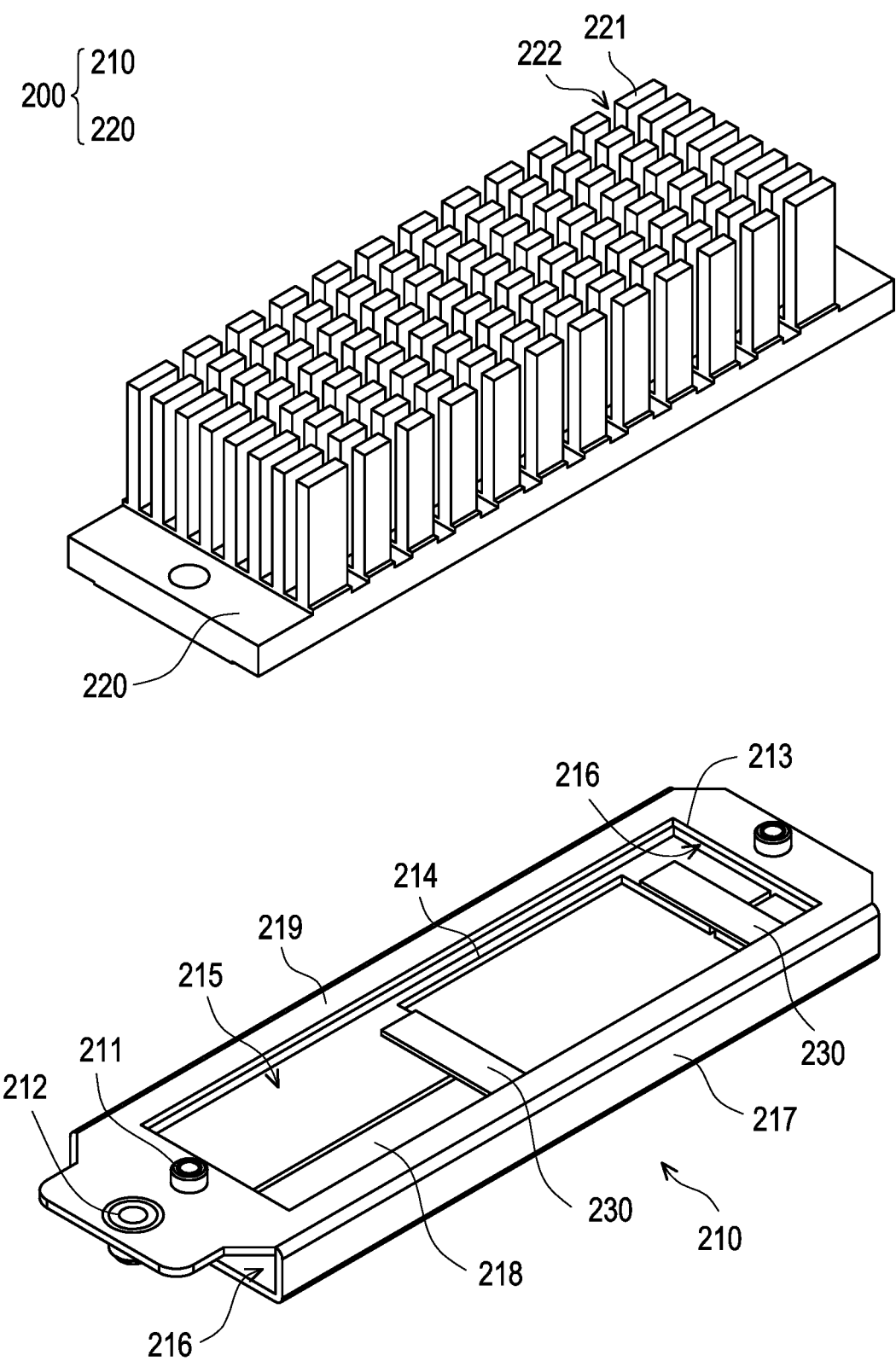
FIG. 2 is an exploded schematic diagram of the heat dissipation module of FIG. 1.
Figure 3:
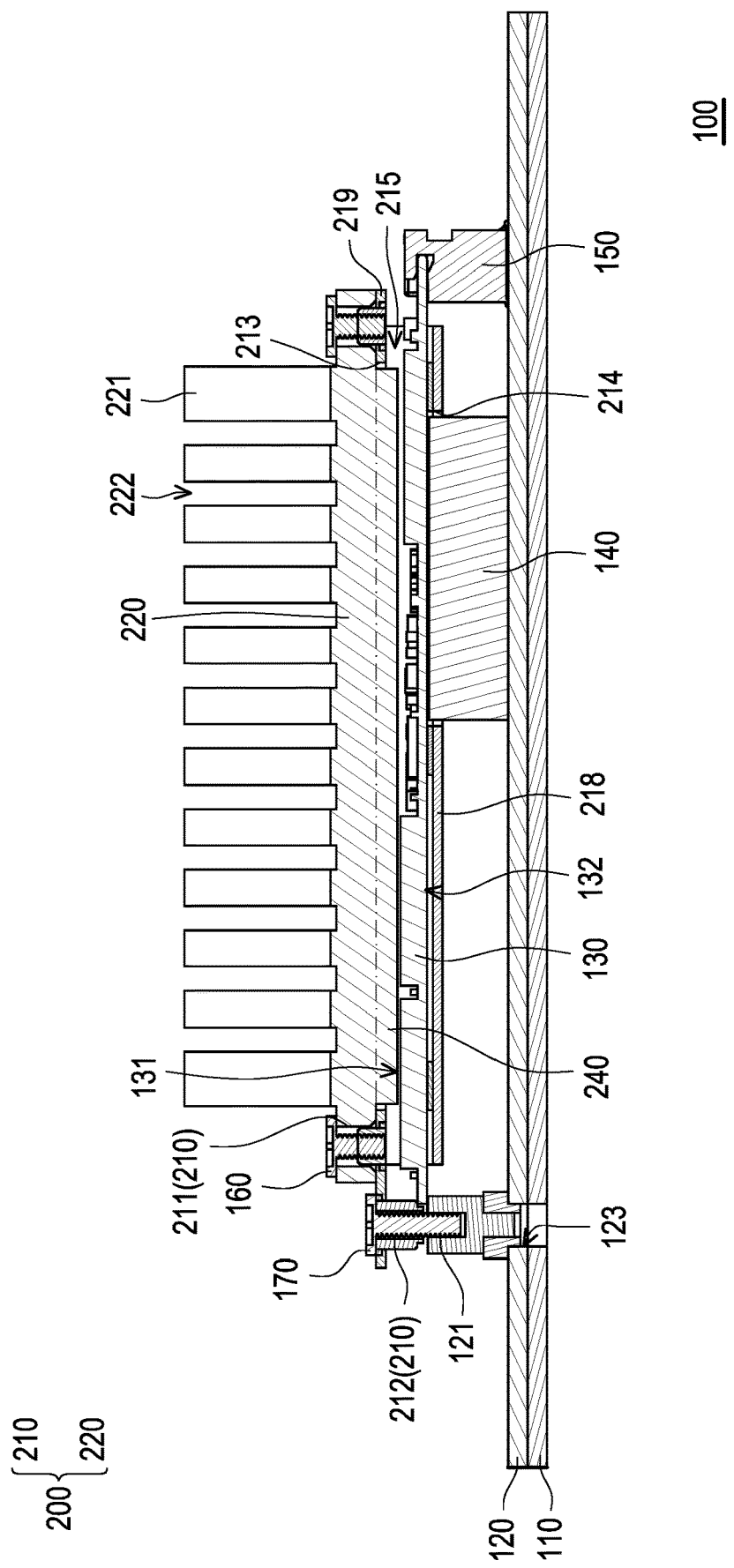
FIG. 3 is a schematic cross-sectional view of the heat dissipation module of FIG. 1.

Please refer to FIGS. 2 and 3. FIG. 2 is an exploded schematic diagram of the heat dissipation module of FIG. 1. FIG. 3 is a schematic cross-sectional view of the heat dissipation module of FIG. 1. The supporting bracket 210 further includes two side walls 217 and two through grooves 216. The two ends of the two side walls 217 are connected to the first side 219 and the second side 218, respectively. The two side walls 217, the first side 219, and the second side 218 surround the accommodating space 215, enabling the accommodating space 215 to accommodate the SSD interface card 130.

In one embodiment, the supporting bracket 210 is fabricated by bending with a sheet metal method, but it is not limited thereto.

In one embodiment, a buffer element 230 is provided in the accommodating space 215. The buffer element 230 is, for example, provided on the second side 218 as a buffer, which can reduce the deformation of the SSD interface card 130 during assembly or transportation.

Figure 4:
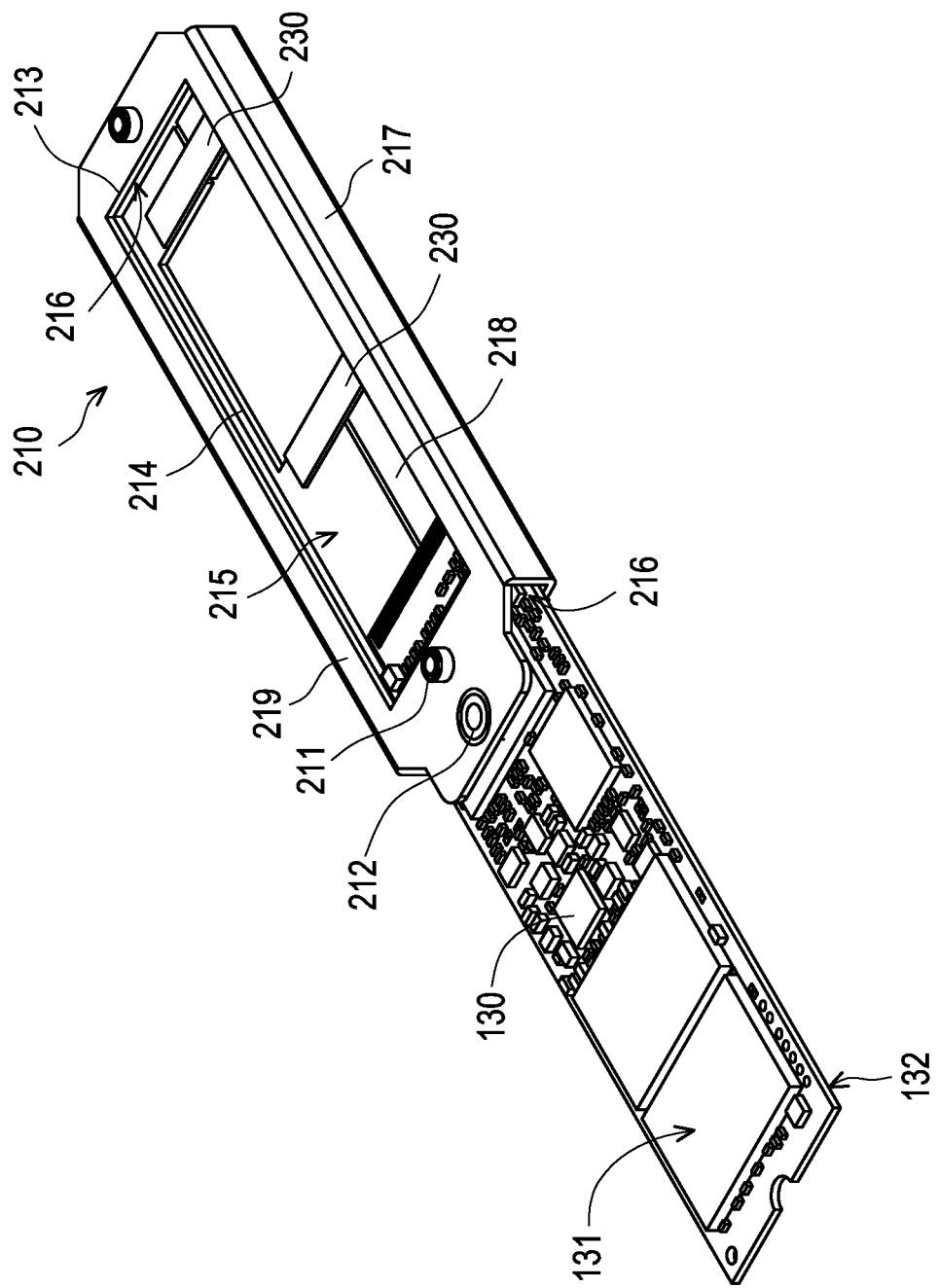
FIGS. 4 to 7 are schematic diagrams of the assembly process of the heat dissipation module of the disclosure.

Please refer to FIG. 3. The first side 219 includes a first opening 213, and the second side 218 includes a second opening 214. The heat dissipation element 220 is located on the first side 219 and covers the first opening 213. The heat generated by the SSD interface card 130 is not only indirectly transferred to the heat dissipation element 220 through the supporting bracket 210, but also directly transferred to the heat dissipation element 220 through the first Please refer to FIGS. 2 and 4. The opposite ends of the supporting bracket 210 are disposed with a through groove 216, respectively. The SSD interface card 130 enters the accommodating space 215 through the through groove 216. One end of the SSD interface card 130 passing through the through groove 216 and a connector 150 are connected, and the other end is combined to the M.2 bonding hole 121 on the circuit board 120 through the second mounting hole 212.

Please refer to FIGS. 2 and 3. In one embodiment, the heat dissipation element 220 includes multiple heat dissipation fins 221, and a groove 222 is formed between two adjacent heat dissipation fins 221.

The disclosure further provides an electronic device 100. The electronic device 100 includes a housing 110, a circuit board 120, an SSD interface card 130, a connector 150, and a heat dissipation module 200. The circuit board 120 is disposed in the housing 110 and includes an M.2 bonding hole 121 (123). The structure of the heat dissipation module 200 is as described above, so the description is not repeated here.

In one embodiment, the electronic device 100 is a desktop computer or a notebook computer, and the disclosure is not limited thereto.

Please refer to FIG. 3. In one embodiment, the first heat conductive element 140 is disposed on the circuit board 120 corresponding to the second opening 214. The second heat conductive element 240 is disposed between the SSD interface card 130 and the heat dissipation element 220. The SSD interface card 130 is located between the heat dissipation element 220 and the first opening 213.

The SSD interface card 130 includes a first surface 131 and a second surface 132 opposite to each other, and the second heat conductive element 240 is in contact with the first surface 131 of the SSD interface card 130. The second opening 214 is adapted for the first heat conductive element 140 to pass through, and the first heat conductive element 140 is in contact with the second surface 132 of the SSD interface card 130 to dissipate heat of the SSD interface card 130.

In other words, the first heat conductive element 140 and the second heat conductive element 240 dissipate heat of the first surface 131 and the second surface 132 of the SSD interface card 130, respectively, providing two different heat dissipation paths to improve heat dissipation efficiency.

FIGS. 4 to 7 are schematic diagrams of the assembly process of the heat dissipation module of the disclosure. Please refer to FIGS. 1 and 4. During installation, firstly, assemble the SSD interface card 130 to the supporting bracket 210, and make the SSD interface card 130 pass through the through groove 216.

Figure 5:
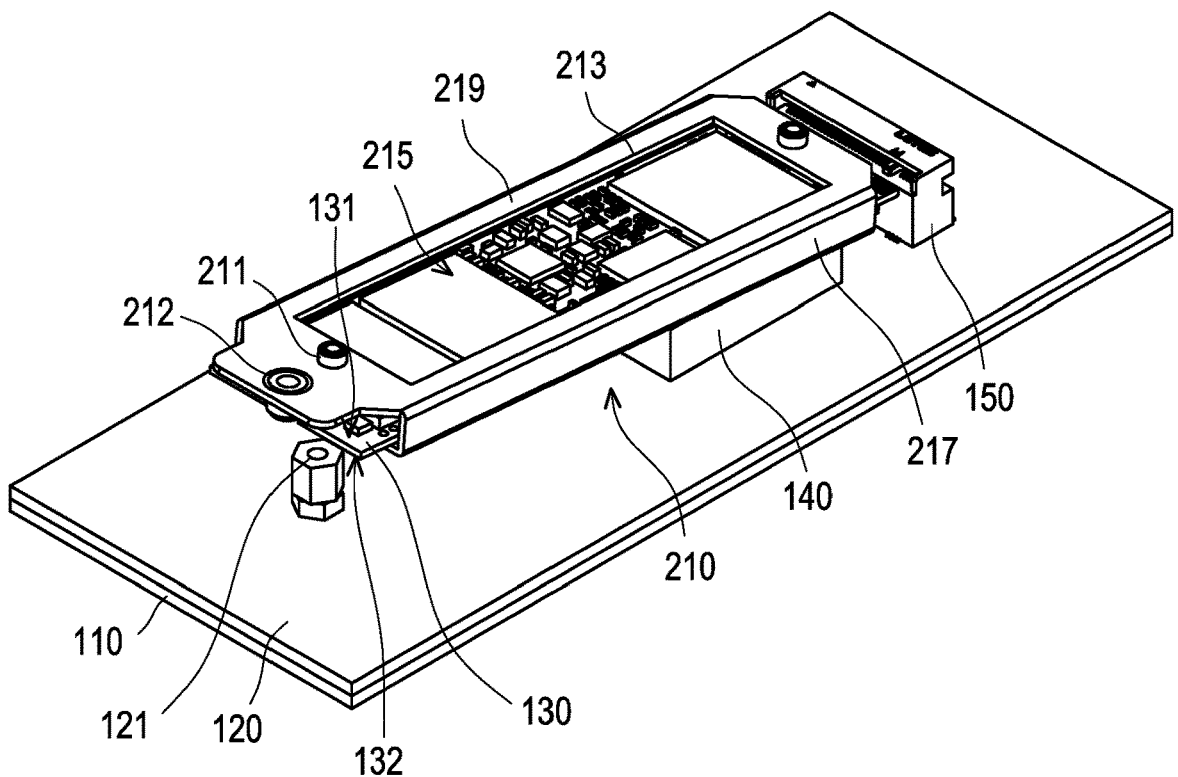

Please further refer to FIG. 5. And then place the supporting bracket 210 with the SSD interface card 130 assembled on the circuit board 120, and connect the SSD interface card 130 and the connector 150. At this time, the first heat conductive element 140 passes through the second opening 214 and is in contact with the second surface 132 of the SSD interface card 130.

Figure 6:
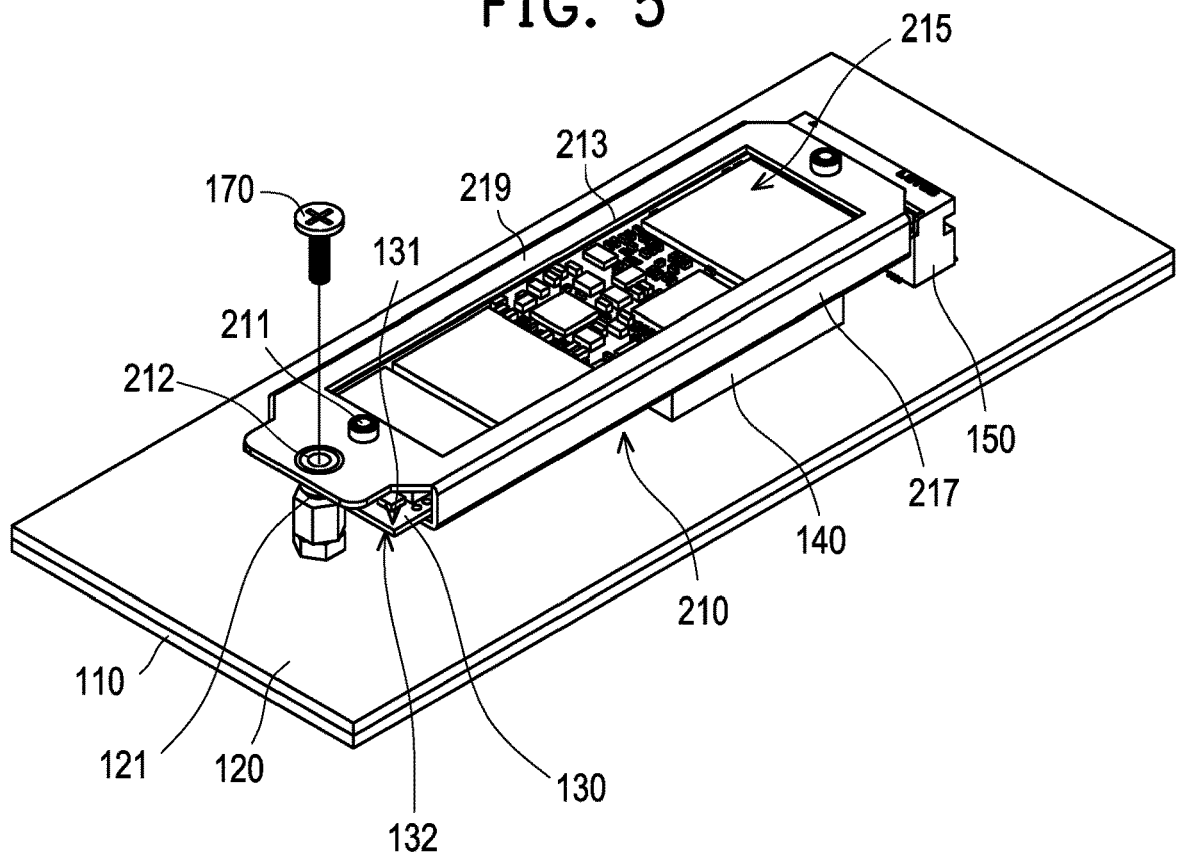
Figure 7:
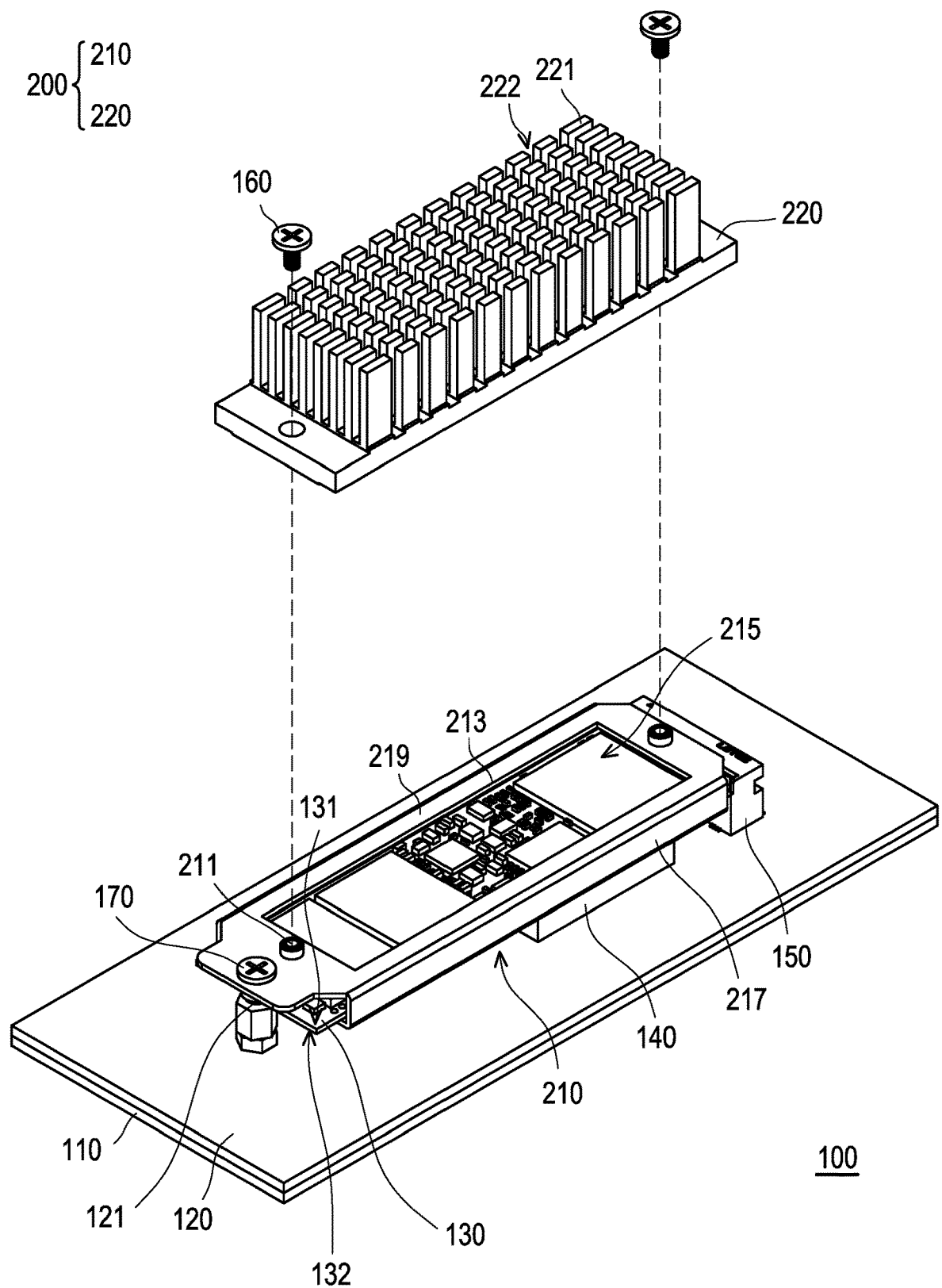

Please further refer to FIG. 6. A second locking element 170 is configured to lock the second mounting hole 212 to fix the SSD interface card 130 and the supporting bracket 210 to the circuit board 120 at the same time. Please further refer to FIG. 7. Finally, a first locking element 160 is configured to lock the first mounting hole 211 to fix the heat dissipation element 220 on the supporting bracket 210. At this time, the second heat conductive element 240 passes through the first opening 213 and is in contact with the first surface 131 of the SSD interface card 130.

When the SSD interface card is installed in the accommodating space of the supporting bracket, the SSD interface card and the supporting bracket are combined to the circuit board through the second mounting hole, and the heat dissipation element is combined to the supporting bracket through the first mounting hole. Thus, the assembly is convenient and the heat dissipation efficiency of the SSD interface card is improved at the same time.

What is claimed is:

1. A heat dissipation module, adapted for a circuit board, wherein the circuit board has an M.2 bonding hole, the heat dissipation module, comprising:
    a supporting bracket, having a first side and a second side opposite to each other, and an accommodating space located between the first side and the second side and adapted for installing an SSD interface card, wherein the first side has a first mounting hole and a second mounting hole; and
    a heat dissipation element, coupled to the first side through the first mounting hole;
    wherein, when the SSD interface card is installed in the accommodating space, the SSD interface card and the supporting bracket are combined to the M.2 bonding hole through the second mounting hole so that the second side faces the circuit board, wherein the supporting bracket has two through grooves, both of the two through grooves are adapted to the SSD interface card to pass through so as to enter the accommodating space, wherein each of the two through grooves is located between the first side and the second side, the two through grooves is connected to the accommodating space, and the two through grooves are located on opposite two sides of the accommodating space.

2. The heat dissipation module according to claim 1, wherein the first side has a first opening, and the heat dissipation element is located on the first side and covers the first opening.

3. The heat dissipation module according to claim 1, wherein the second side has a second opening.

4. The heat dissipation module according to claim 3, further comprising a first heat conductive element disposed on the circuit board corresponding to the second opening.

5. The heat dissipation module according to claim 1, further comprising a plurality of buffer elements disposed in the accommodating space.

6. The heat dissipation module according to claim 1, wherein the supporting bracket further comprises two side walls, and two ends of the two side walls are connected to the first side and the second side, respectively, and the two side walls, the first side, and the second side surround the accommodating space.

7. The heat dissipation module according to claim 1, further comprising a second heat conductive element disposed between the SSD interface card and the heat dissipation element.

8. The heat dissipation module according to claim 1, wherein the heat dissipation element has a plurality of heat dissipation fins.

9. An electronic device, comprising:
a housing;
a circuit board, disposed in the housing and having an M.2 bonding hole;
an SSD interface card; and
a heat dissipation module, comprising:
a supporting bracket, having a first side and a second side opposite to each other, and an accommodating space located between the first side and the second side and adapted for installing the SSD interface card, wherein the first side has a first mounting hole and a second mounting hole; and
a heat dissipation element, combined to the first side through the first mounting hole;
wherein, when the SSD interface card is installed in the accommodating space, the SSD interface card and the supporting bracket are combined to the M.2 bonding hole through the second mounting hole so that the second side faces the circuit board,
wherein the supporting bracket has two through grooves, both of the two through grooves are adapted to the SSD interface card to pass through so as to enter the accommodating space, wherein each of the two through grooves is located between the first side and the second side, the two through grooves is connected to the accommodating space, and the two through grooves are located on opposite two sides of the accommodating space.

* * * * *